(12) United States Patent
Marz et al.

(10) Patent No.: US 7,800,220 B2
(45) Date of Patent: Sep. 21, 2010

(54) POWER ELECTRONICS ASSEMBLY WITH COOLING ELEMENT

(75) Inventors: Martin Marz, Nuremberg (DE); Ernst Schimanek, Nuremberg (DE); Dieter Brunner, Bayreuth (DE); Andreas Schletz, Etzenricht (DE)

(73) Assignee: ECPE Engineering Center for Power Electronics GmbH, Nuremberg (DE)

( * ) Notice: Subject to any disclaimer, the term of this patent is extended or adjusted under 35 U.S.C. 154(b) by 115 days.

(21) Appl. No.: 12/279,023

(22) PCT Filed: Feb. 9, 2007

(86) PCT No.: PCT/EP2007/001115

§ 371 (c)(1),
(2), (4) Date: Aug. 11, 2008

(87) PCT Pub. No.: WO2007/090664

PCT Pub. Date: Aug. 16, 2007

(65) Prior Publication Data

US 2009/0219694 A1 Sep. 3, 2009

(30) Foreign Application Priority Data

Feb. 10, 2006 (DE) .................. 10 2006 006 175

(51) Int. Cl.
| | |
|---|---|
| *H01L 23/34* | (2006.01) |
| *H05K 7/20* | (2006.01) |
| *F28F 7/00* | (2006.01) |
| *H01B 9/06* | (2006.01) |

(52) U.S. Cl. .................. 257/714; 361/699; 361/703; 361/719; 257/717; 257/722; 257/707; 165/80.4; 165/80.5; 165/104.33; 174/15.1; 174/252

(58) Field of Classification Search .................. 361/699, 361/703, 719; 165/80.4–80.5, 104.33; 257/713, 257/714, 715, 716, 717, 722, 706, 707; 174/15.1, 174/252

See application file for complete search history.

(56) References Cited

U.S. PATENT DOCUMENTS

| | | | |
|---|---|---|---|
| 4,766,481 A * | 8/1988 | Gobrecht et al. | ............ 257/664 |
| 5,455,458 A | 10/1995 | Quon et al. | |
| 5,966,291 A | 10/1999 | Baumel et al. | |

(Continued)

FOREIGN PATENT DOCUMENTS

DE        3336979        4/1984

(Continued)

*Primary Examiner*—Zachary M Pape
(74) *Attorney, Agent, or Firm*—Hoffmann & Baron, LLP

(57) ABSTRACT

The invention concerns a power electronic arrangement comprising an insulating substrate, a cooling element arranged beneath the insulating substrate and one or more power electronic components disposed on a respective metallization surface of the insulating substrate. Disposed on the surface of the insulating substrate is a metal layer portion which projects beyond the insulating substrate at all sides. The region of the metal layer portion, that projects beyond the insulating substrate, forms a metal flange which borders the insulating substrate. The cooling element, on its side towards the insulating substrate, beneath the insulating substrate, has one or more recesses, whereby a cavity delimited by the insulating substrate and wall surfaces of the one or more recesses is formed beneath the insulating substrate for receiving a liquid cooling agent. The metal flange is further connected to the cooling element.

10 Claims, 3 Drawing Sheets

U.S. PATENT DOCUMENTS

| | | | |
|---|---|---|---|
| 6,154,369 A | 11/2000 | Martinez, Jr. et al. | |
| 6,483,185 B1 * | 11/2002 | Nagase et al. | 257/706 |
| 6,594,149 B2 * | 7/2003 | Yamada et al. | 361/699 |
| 2001/0017763 A1 | 8/2001 | Kaufmann | |
| 2003/0056892 A1 * | 3/2003 | Petitbon et al. | 156/272.8 |

FOREIGN PATENT DOCUMENTS

| | | |
|---|---|---|
| DE | 3643288 | 6/1988 |
| DE | 19645636 | 3/1998 |
| DE | 19735531 | 2/1999 |
| DE | 10006215 | 8/2001 |
| EP | 1124259 | 8/2001 |
| EP | 1416534 | 5/2004 |

* cited by examiner

POWER ELECTRONICS ASSEMBLY WITH COOLING ELEMENT

This application claims priority based on an International Application filed under the Patent Cooperation Treaty, PCT/EP2007/001115, filed on Feb. 9, 2007 and German Application No. 102006006175.6-33, filed on Feb. 10, 2006.

BACKGROUND OF THE INVENTION

The invention concerns a power electronic arrangement which is provided with an insulating substrate, a cooling element arranged beneath the insulating substrate and at least one power electronic component which is disposed on one side of the insulating substrate in opposite relationship to the cooling element on a metallisation surface of the insulating substrate.

An arrangement of that kind is known from DE 33 36 979 A1. The thyristor module described therein has an insulating substrate of aluminum oxide provided on both sides with a metallisation layer. The upwardly disposed metallisation layer is structured appropriately for the circuitry involved and is connected to electrode plates of a thyristor chip and a diode chip by way of a solder connection. The oppositely disposed, underneath metallisation layer is connected to a cooling body comprising a metal plate, by way of a solder connection.

A semiconductor arrangement of that kind is also described in DE 36 43 288 C2. The semiconductor component of modular structure described therein has a module wafer with an insulating plate provided on both sides with metallisations and arranged on a cooling body serving as a carrier body. Arranged on the side of the insulating plate, that is opposite to the cooling body, are semiconductor elements, for example diodes, transistors and thyristors, but also semiconductor-based resistors and/or capacitors. The cooling body is in the form of a plate-shaped or block-shaped cooling body which can also involve separate external cooling.

Furthermore it is known for separate external cooling of a cooling body for a semiconductor arrangement to be implemented by the cooling body having a cooling agent flowing therethrough, whereby the power electronic device is cooled by way of the laminate structure.

A disadvantage with the solutions known at the present time for directly cooled electronic power modules is the relatively large number of layers, made up of materials involving different thermal coefficients of expansion. The semiconductor elements are disposed on a metal layer portion which in turn is disposed on an insulating substrate connected by way of a further metal layer portion laminated thereto and a solder, to a metallic base plate having an afflux flow of cooling agent thereto. That results in a reduced cycle strength and thus a reduced service life.

SUMMARY OF THE INVENTION

The object of the invention is thus to provide an improved structure for a directly cooled semiconductor arrangement.

That object is attained by a power electronic arrangement comprising an insulating substrate which is provided with one or more metallisation surfaces, a cooling element arranged beneath the insulating substrate and one or more power electronic components which are disposed on one side of the insulating substrate in opposite relationship to the cooling element on the respective metallisation surfaces, wherein disposed on a surface of the insulating substrate is a metal layer portion which projects beyond the insulating substrate at all sides and thus the region of the metal layer portion projecting beyond the insulating substrate forms a metal flange which borders the insulating substrate, wherein the cooling element has one or more openings on its side towards the insulating substrate beneath the insulating substrate and provided beneath the insulating substrate is a cavity delimited by the insulating substrate and wall surfaces of the one or more openings for receiving a liquid cooling agent and the metal flange is connected to the cooling element. The solution according to the invention provides a higher level of cycle strength, a simplification in the sealing arrangement and a more compact structure.

In accordance with a preferred embodiment of the invention the power electronic arrangement has a peripherally extending clamping frame overlapping the metal flange and the metal flange is clamped between the clamping frame and the cooling element.

The metal flange is pressed against the cooling element by means of the clamping frame whereby a force-locking connection and sealing integrity are implemented at the same time. That permits a direct afflux flow against the underside of the insulating substrate by means of the cooling agent, with an enhanced cycle strength. If the insulating layer were clamped directly between the clamping frame and the cooling element, then, in addition to mechanical fixing of the module, the pressing force would thus have to be applied to provide for the necessary sealing integrity against the insulating substrate by way of a seal, which on the one hand would lead to an increased risk of breakage upon assembly and also a reduced cycle strength. The connection between an insulating substrate and a (metallic) cooling device has a high level of static friction by virtue of the oxidised surface of the cooling device, which leads to thermal stress and breakage of the insulating substrate. Those disadvantages are avoided in this solution according to the invention.

Instead of a force-locking connection between the cooling element and the metal flange it is also possible for the cooling element and the metal flange to be joined by a connection involving intimate joining of the materials involved. Thus the metal flange can be connected to the cooling element by way of a peripherally extending weld seam which at the same time provides a positively locking connection and sealing integrity. Furthermore it is possible for the flange to be welded into the cooling element for example by laser welding or for the metal flange to be joined to the cooling element by soldering or adhesive.

Preferably a ceramic substrate in plate form is used as the insulating substrate. A ceramic substrate has a lower thermal transfer resistance than a plastic substrate. The invention achieves an increased cycle strength even when using a ceramic substrate, the use of which in itself is particularly critical by virtue of its surface nature and its tendency to fracture (relatively brittle).

The metal layer portion forming the metal flange is preferably of a thickness of between 0.1 mm and 5 mm, in particular a thickness of between 0.1 mm and 2 mm.

In accordance with a preferred embodiment of the invention the metal layer portion which forms the metal flange is disposed on the surface of the insulating substrate, that is opposite to the cooling element. In that respect it is desirable for the metal layer portion to be structured in such a way that the metallisation surfaces which are formed by the metal layer portion and on which power electronic components are arranged or which are galvanically connected to power electronic components are electrically insulated from the region of the metal layer portion, that forms the metal flange, by suitable interruptions in the metal layer portion.

Furthermore it is also possible for the metal layer portion forming the metal flange to be disposed on the surface of the insulating substrate, that is towards the cooling element.

The insulating substrate is preferably suitably structured on its side towards the cooling element to achieve a low level of thermal resistance in relation to the cooling agent.

In accordance with a preferred embodiment of the invention the peripherally extending clamping frame overlaps the insulating substrate. That prevents the insulating substrate from breaking in the event of an excessive pressure in respect of the cooling agent. Furthermore it is advantageous if the clamping frame is provided with legs which fix the substrate against an increased pressure not just at the edge. That is advantageous in particular when using ceramic plates of larger surface area as the insulating substrate.

It can further be provided that the insulating substrate is mounted by way of one or more spacers on the cooling element. In the case of a reduced pressure in respect of the cooling agent, that prevents fracture of the insulating substrate.

Further advantages are achieved by a bellows configuration or a corrugation being shaped in the metal flange. The bellows configuration or the corrugation is in that case preferably formed in the metal flange between the insulating substrate and the region of the metal flange, by the metal flange being gripped between the sealing surfaces of the clamping frame and of the cooling element. The corrugation or the bellows configuration provides that thermal/mechanical stresses which are caused by the differing coefficients of expansion of the materials used or by an increased pressure or a reduced pressure in respect of the cooling agent are resiliently absorbed. That obviates fracture of the insulating substrate. Furthermore the notch action between the metal flange and the insulating substrate is minimised and that therefore prevents premature detachment of the flange from the insulating substrate.

In accordance with a preferred embodiment of the invention the clamping frame and/or the cooling element has sealing cutting edges in the region of the sealing surfaces. The sealing cutting edges elastically and plastically deform the metal flange upon assembly after penetration into the metal flange, whereby an excellent sealing integrity is achieved.

BRIEF DESCRIPTION OF THE DRAWINGS

The invention is described by way of example hereinafter by means of a number of embodiments with reference to the accompanying drawings in which.

DETAILED DESCRIPTION OF THE INVENTION

Figure 1:
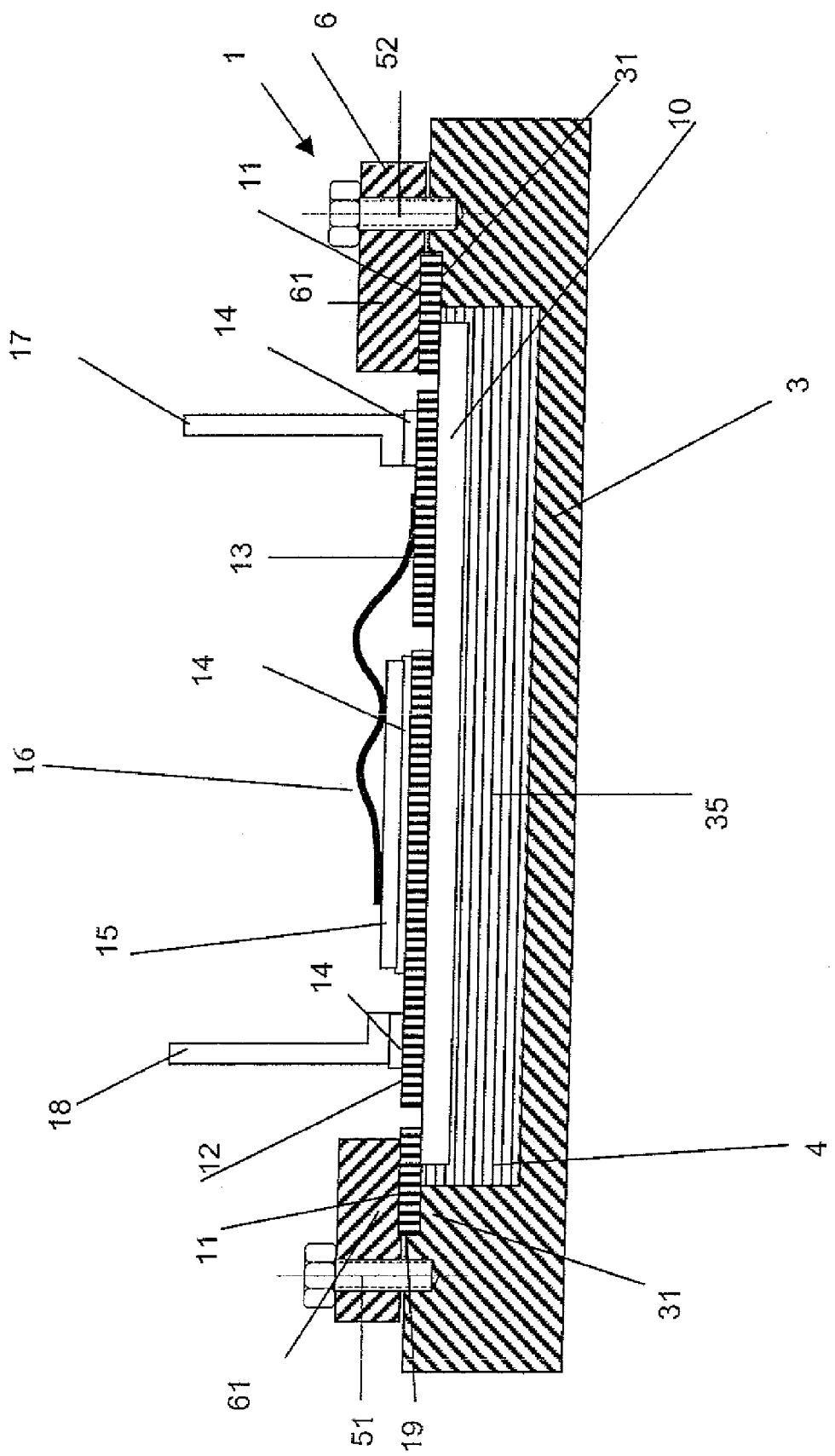
FIG. 1 shows a sectional view of a semiconductor arrangement according to the invention in accordance with a first embodiment of the invention.

FIG. 1 shows a power electronic arrangement 1 with a cooling element 3, a clamping frame 6 and an insulating substrate 10.

The insulating substrate 10 is a ceramic substrate in plate form, the thickness of which is greater than 0.1 millimeter. Preferably the insulating substrate is of a thickness of between 0.2 and 4 millimeter. The insulating ceramic preferably comprises aluminum oxide, aluminum nitride, boron nitride or silicon nitride. It is also possible for the insulating substrate 10 to comprise a plastic material or a plastic material which is filled with ceramic.

On its top side the insulating substrate 10 is provided with a metal layer portion 19 which is bonded on to the insulating substrate or soft-soldered, actively soldered or brazed or laminated on to the insulating substrate. The metal layer portion 19 forms on the insulating substrate 10 a plurality of metallisation surfaces of which two metallisation surfaces 12 and 13 are shown in FIG. 1. Arranged on those metallisation surfaces are power electronic components such as thyristors, diodes and transistors. Thus FIG. 1 shows a transistor chip 15 which is connected to the metal surface 12 by way of an underside metallisation surface by means of a solder 14. It is further possible for passive components such as resistors and capacitors and/or current connection elements to be also disposed on the metallisation surfaces. Thus the metallisation surface 13 is connected to the current connection element 17 by way of a solder 14 and the metallisation surface 12 is connected to the current connection element 18 by way of a solder 14. The transistor chip 15 is in turn connected to the metallisation surface 13 by way of a bond wire 16.

In this case the metal layer portion 19 is disposed on the insulating substrate in such a way that it projects beyond the insulating substrate. As shown in FIG. 1 the region of the metal layer portion 19, that projects beyond the insulating substrate 10, forms a metal flange 11 which borders the insulating substrate on all sides. In that case the metal layer portion 19 is so structured that the metal flange 11 is electrically insulated from the actual circuit. It is however also possible for the metal flange to be connected to metallisation surfaces forming ground surfaces.

The metal layer portion 19 preferably comprises copper or a copper alloy. In addition it is also possible for the metal layer portion to comprise aluminum or an alloy based on copper, nickel and/or aluminum. The metal layer portion is of a thickness of between 0.1 and 5 millimeters, preferably between 0.3 and 2 millimeters.

The power electronic module formed by the insulating substrate 10, the metal layer portion 19 and the electrical components disposed on the metal layer portion 19 is placed on the cooling element 3 upon assembly. The cooling element 3 has an opening on its side towards the insulating substrate 10 beneath the insulating substrate 10, the opening being covered by the power electronic module. Furthermore, in the regions in which the metal flange 11 lies thereon, the cooling element 3 has a peripherally extending sealing surface 31 which completely borders the insulating body 10.

Thus, provided beneath the insulating substrate 10 is a cavity 35 which is delimited by the insulating substrate 10 and the edge surfaces of the opening and which after assembly is filled with a liquid cooling agent 4 or has a cooling agent flowing therethrough.

The cooling element 3 is preferably an aluminum or steel body which has suitable feed and discharge means for the cooling agent. In addition it is also possible for the cooling element to comprise copper, brass, an aluminum or copper alloy, ceramic or plastic material. Furthermore it is also possible for two or more openings to be formed in the cooling element 3 in the region of the insulating substrate 10. The openings are structured for example by legs or spacers for support in relation to the insulating substrate 10.

In accordance with a further embodiment of the invention the cooling element 3 is recessed for cooling two or more electronic power modules.

The clamping frame 6 comprises a metal frame which overlaps the metal flange 11 on all sides. At its underside, in the region of the metal flange 11, the metal frame has a peripherally extending sealing surface 61. In order to achieve secure mechanical fixing of the power electronic module in relation to the cooling element 3 and to prevent the metal flange 11 from coming loose from the insulating substrate 10 the clamping frame 6 overlaps the edge regions of the insulating substrate 10. It is however also possible that the clamping frame 6 does not cover over the edge regions of the insulating substrate 10.

It is also possible for the clamping frame 6 to have one or more legs which extend from the edge regions of the insulating substrate 10 into central regions of the insulating substrate 10 and permit direct application of the pressure exerted by the cooling agent to the cooling frame and thus reduce the mechanical loading on the insulating substrate. Preferably in that case those legs are fitted on regions of the metal layer portion, that are provided for that purpose and are insulated from the actual electronic assembly of the power electronic module.

In addition it is also possible to provide a support frame which is fixed on the clamping frame 6 or the cooling element 3 and which also, as described above, reduces the mechanical loading of the insulating substrate 10. That support frame can be made for example from glass fiber-reinforced plastic material. It is also possible for the support frame at the same time to form a holding frame for the electronic actuating means.

The clamping frame 6 is screwed to the cooling element 3 by way of a plurality of clamping screws of which FIG. 1 shows two clamping screws 51 and 52. The metal flange 11 is pressed against the cooling element when the clamping frame 6 is screwed to the cooling element 3, in the region of the peripherally extending sealing surfaces 61 and 31, thereby providing a force-locking connection between the power electronic module and the cooling element and at the same time also providing for sealing integrity in respect of the cavity 35 provided for receiving the liquid cooling agent. For that purpose, shaped in the cooling element 3 or the clamping frame 6 is a peripherally extending groove which serves to receive the edge regions of the metal flange 11 and the depth of which is matched to the thickness of the metal layer portion 19 for example to achieve an oversize fit. In this way, metal flange 11 acts as a spacer between cooling element 3 and clamping frame 6.

It is further possible for a peripherally extending adhesive or sealing agent layer or a sealing ring to be provided between the metal flange and the sealing surfaces of the cooling element.

Furthermore it is also possible that the metal layer portion 19 does not project beyond the insulating substrate 10 at all sides as shown in FIG. 1, but rather a metal layer portion which projects beyond the insulating substrate at all sides is provided on the underside of the insulating substrate 10. In the same manner as the metal layer portion 19 shown in FIG. 1, that metal layer portion forms a metal flange which borders the insulating substrate at all sides. In that case, that lower metal layer portion can be structured and provided for example only in the edge regions of the insulating substrate 10. It is however also possible that the lower metal layer portion covers the insulating substrate over its full surface area in order thus for example to provide particularly good adhesion between the metal layer portion and the insulating substrate 10 or to afford an additional moisture barrier layer between the insulating substrate 10 and the cooling agent 4. In this case the lower metal layer portion is of a configuration like the metal layer portion 19, it thus preferably comprises a thin copper or aluminum layer of a thickness of between 0.1 mm and 2 mm.

The metal flange formed by the lower metal layer portion is now gripped in a similar manner to that shown in FIG. 1 between the clamping frame and the cooling element, thereby simultaneously providing a force-locking connection and affording sealing integrity for the cavity 35. In that respect it is advantageous for the clamping frame 6 to be suitably recessed so that after assembly the edge region of the insulating substrate rests on the clamping frame over the fullest possible surface area and thus the contact pressure exerted by the cooling agent is absorbed by the clamping frame. For that purpose for example provided in the underside of the clamping frame is a suitable peripherally extending groove, the depth of which corresponds to the thickness of the insulating substrate 10.

In addition it is also possible for structures of a heat-conductive material to be disposed on a metal layer portion provided on the underside of the insulating substrate 10, to enlarge the surface area and thus to reduce the thermal transfer resistance. Thus for example shaped portions comprising a copper sheet are soldered on such a rear-side metallisation. Advantageously the structures applied are so selected that they have a low level of lateral stiffness and thus do not have any adverse effects on alternating load strength.

Figure 2:
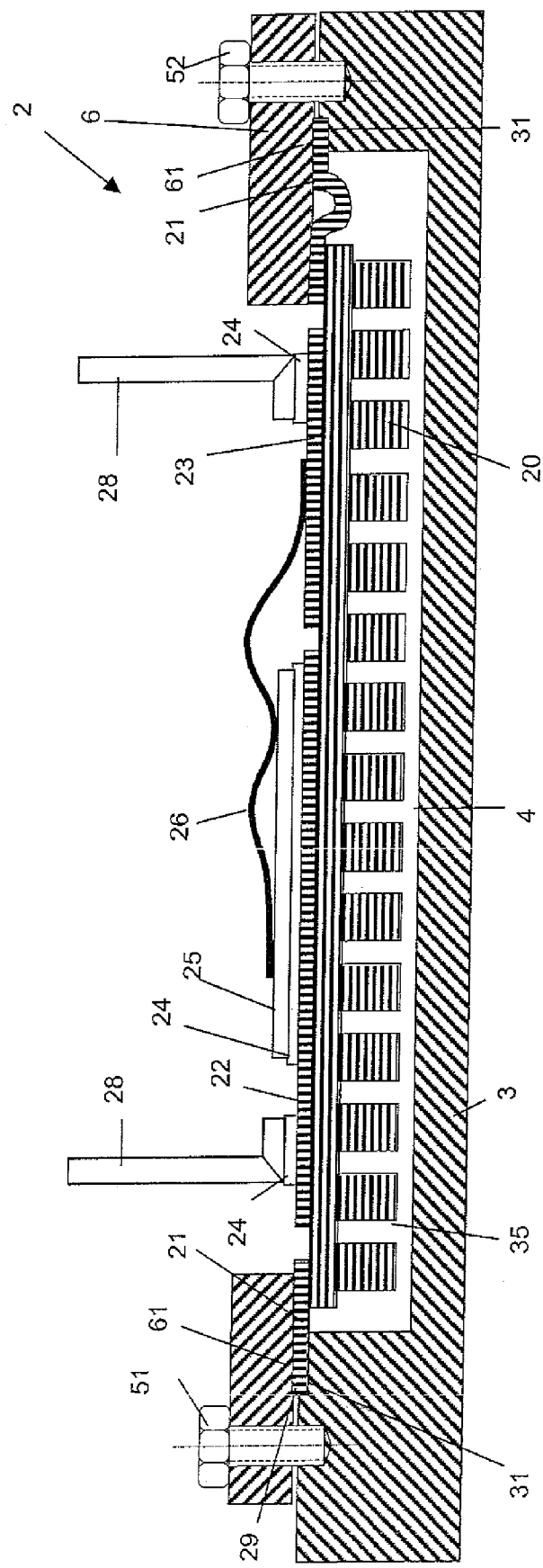
FIG. 2 shows a sectional view of a semiconductor arrangement according to the invention in accordance with a further embodiment of the invention.

FIG. 2 shows a power electronic arrangement 2 which is constructed in accordance with a further embodiment of the invention. FIG. 2 shows in detail a power electronic module having an insulating substrate 20, a metal layer portion 29, a power electronic component 25 and current connection elements 28. The insulating substrate 20 is suitably structured on its underside to achieve a low thermal transfer resistance in relation to the cooling agent. As shown in FIG. 2 shaped in the underside of the insulating substrate 20 are grooves which enlarge the surface area at the rear of the insulating substrate and thus reduce the thermal transfer resistance.

The metal layer portion 29 has metallisation surfaces 22 and 23 on which electrical components are fixed. Thus the power electronic component 25 is connected to the metallisation surface 22 by way of a solder connection, that is to say by way of a solder 24, and the current connection elements 28 are connected to the metallisation surfaces 22 and 23 respectively by way of respective solder joins. The power electronic component 25 is further connected to the metallisation surface 23 by way of a bond wire 26.

In this case the metal layer portion 29 projects beyond the insulating substrate 20 at all sides and in the region projecting beyond the insulating substrate 20 forms a metal flange 21 bordering the insulating substrate 20 on all sides.

The power electronic arrangement further has the clamping frame 6 already described with reference to FIG. 1 and the cooling element 3 already described with reference to FIG. 1, wherein the metal flange 21 is gripped in its edge region between the cooling element 3 and the clamping frame 6 by means of clamping screws 51 and 52. In addition it is also possible to use rivets or screws with spring washers instead of the clamping screws 51 and 52.

In this case, in a similar manner to the embodiment of FIG. 1, in a first region the metal flange is clamped between the lower sealing surface 31 shaped in the cooling element and the sealing surface 61 of the clamping frame, thereby simultaneously providing a force-locking connection and affording sealing integrity. In addition in a second region a corrugation or also a bellows configuration is shaped in the metal flange.

In this case the corrugation or the bellows configuration is shaped in the portion of the metal flange 21, that is between the substrate 20 and the sealing surfaces 31 and 61 respectively of the cooling element 3 and the clamping frame 6 respectively. That is shown in detail in FIG. 3a.

Figure 3A:
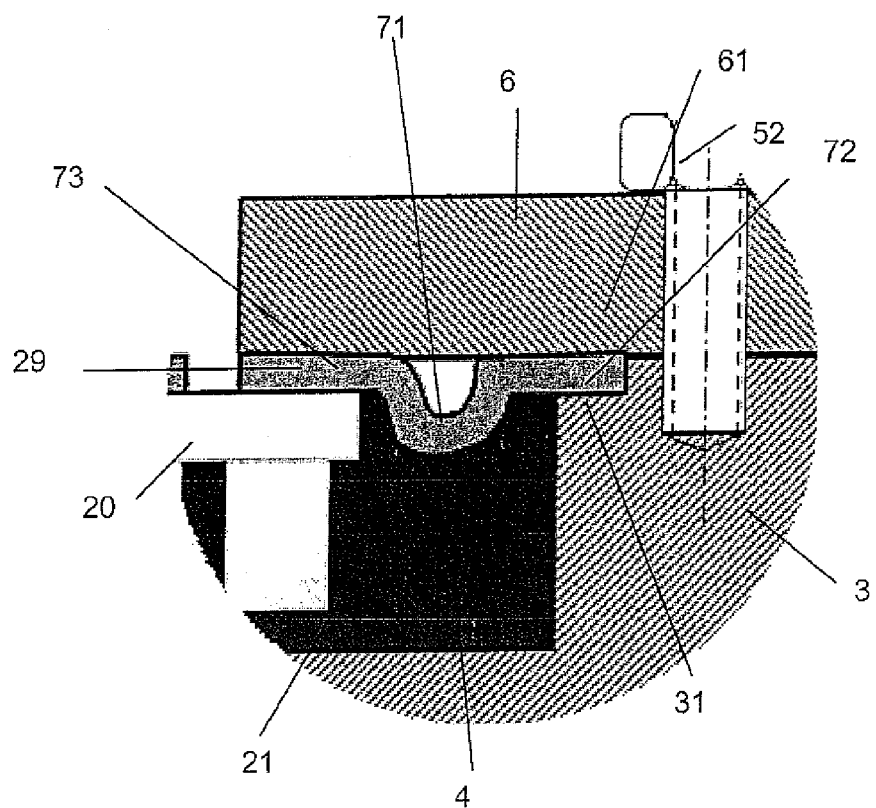
FIG. 3a shows a partial view of the power electronic arrangement shown in FIG. 2.

FIG. 3a shows a corrugation 71 which is shaped in the metal layer portion 29 between a first region 73 thereof, in which the metal layer portion 29 is disposed on the insulating substrate 20, and a second region 72 of the metal layer portion 29, in which the metal flange 21 is clamped between the sealing surfaces 61 and 31 of the clamping frame 6 and the cooling element 3 respectively.

In that respect, it is possible, as described hereinbefore, that the corrugation configuration 71 is shaped only in a portion of the metal flange 21, for example along a longitudinal or transverse edge of the insulating substrate 20, in which the metal flange 21 is shaped. It is however also possible for a peripherally extending corrugation or a peripherally extending bellows configuration to be shaped in the metal flange 21, that borders the insulating substrate 20 on all sides.

In accordance with a further embodiment of the invention provided in the region of the sealing surfaces are one or more sealing cutting edges in the clamping frame and/or in the cooling element. That will now be described by way of example with reference to FIG. 3b.

Figure 3B:
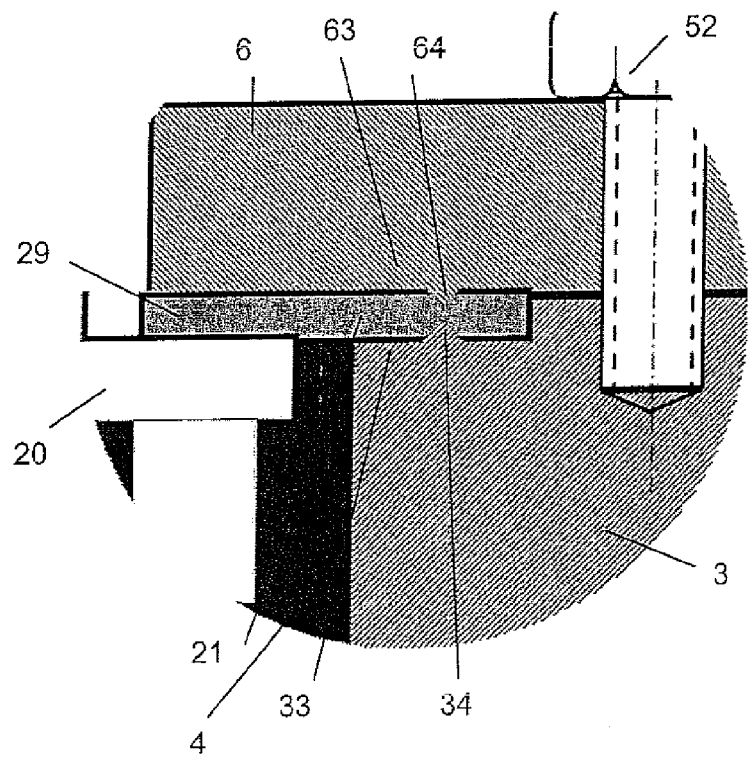
FIG. 3b shows a partial view of a power electronic arrangement according to the invention in accordance with a further embodiment of the invention.

FIG. 3b shows the clamping frame 6, the cooling element 3, the insulating substrate 20, the metal layer portion 29 and the clamping screw 52. The clamping frame 6 has a sealing surface 63 with a sealing cutting edge 64. Likewise the cooling element 3 has a sealing surface 33 with a sealing cutting edge 34. The sealing cutting edges 64 and 34 are arranged in opposite relationship and plastically and elastically deform the metal flange 21 upon assembly as shown in FIG. 3b, thereby providing for sealing integrity for the cavity 35.

What we claim:

1. A power electronic arrangement comprising:
   an insulating substrate which is provided with one or more metallization surfaces,
   a cooling element arranged beneath the insulating substrate and
   one or more power electronic components which are disposed on one side of the insulating substrate in opposite relationship to the cooling element on respective metallisation surfaces, wherein disposed on the surface of the insulating substrate that is in opposite relationship to the cooling element or that is towards the cooling element is a metal layer portion of a thickness of between 0.1 mm and 2 mm, which projects beyond the insulating substrate at all sides, wherein the insulating substrate is a ceramic substrate and the metal layer portion is bonded or actively soldered on to the insulating substrate, and wherein the region of the metal layer portion that projects beyond the insulating substrate forms a metal flange which borders the insulating substrate, the cooling element has one or more openings on its side that is towards the insulating substrate beneath the insulating substrate and provided beneath the insulating substrate is a cavity delimited by the insulating substrate and by wall surfaces of the one or more openings for receiving a liquid cooling agent and the metal flange is connected to the cooling element wherein the power electronic arrangement has a peripherally extending clamping frame overlapping the metal flange and the metal flange is clamped between the clamping frame and the cooling element and is thereby connected to the cooling element, wherein the clamping frame is connected to the cooling element by means of two or more clamping screws.

2. A power electronic arrangement as set forth in claim 1 wherein the metal flange is joined to the cooling element by a connection involving intimate joining of the materials concerned, in particular by welding or soldering.

3. A power electronic arrangement as set forth in claim 1 wherein the metal layer portion forming the metal flange is disposed on the surface of the insulating substrate, that is in opposite relationship to the cooling element, and the metal layer portion is so structured that the metallisation surfaces which are formed by the metal layer portion and which are connected to the one or more power electronic components are electrically insulated from the region of the metal layer portion, that forms the metal flange.

4. A power electronic arrangement as set forth in claim 1 wherein the insulating substrate is structured on its side towards the cooling element to reduce the thermal resistance in relation to the cooling agent.

5. A power electronic arrangement as set forth in claim 1 wherein the peripherally extending clamping frame overlaps the insulating substrate.

6. A power electronic arrangement as set forth in claim 1 wherein the clamping frame is provided with one or more legs.

7. A power electronic arrangement as set forth in claim 1 wherein the cooling element has one or more spacers for support in relation to the insulating substrate.

8. A power electronic arrangement as set forth in claim 1 wherein the metal flange has a bellows configuration or a corrugation.

9. A power electronic arrangement as set forth in claim 1 wherein the metal layer portion forming the metal flange comprises copper, a copper alloy, aluminum or an aluminum alloy.

10. A power electronic arrangement comprising:
    an insulating substrate which is provided with one or more metallization surfaces;
    a cooling element arranged beneath the insulating substrate; and
    one or more power electronic components which are disposed on one side of the insulating substrate in opposite relationship to the cooling element on respective metallisation surfaces, wherein disposed on the surface of the insulating substrate that is in opposite relationship to the cooling element or that is towards the cooling element is a metal layer portion of a thickness of between 0.1 mm and 2 mm, which projects beyond the insulating substrate at all sides, wherein the insulating substrate is a ceramic substrate and the metal layer portion is bonded or actively soldered on to the insulating substrate, and wherein the region of the metal layer portion that projects beyond the insulating substrate forms a metal flange which borders the insulating substrate, the cooling element has one or more openings on its side that is towards the insulating substrate beneath the insulating substrate and provided beneath the insulating substrate is a cavity delimited by the insulating substrate and by wall surfaces of the one or more openings for receiving a liquid cooling agent and the metal flange is connected to the cooling element wherein the power electronic arrangement has a peripherally extending clamping frame overlapping the metal flange and the metal flange is clamped between the clamping frame and the cooling element and is thereby connected to the cooling element, wherein the clamping frame and/or the cooling element has one or more sealing cutting edges in the region of sealing surfaces.

\* \* \* \* \*